United States Patent
Xie et al.

(10) Patent No.: US 10,249,535 B2
(45) Date of Patent: Apr. 2, 2019

(54) FORMING TS CUT FOR ZERO OR NEGATIVE TS EXTENSION AND RESULTING DEVICE

(71) Applicant: GLOBALFOUNDRIES Inc., Grand Cayman (KY)

(72) Inventors: Ruilong Xie, Niskayuna, NY (US); Daniel Chanemougame, Niskayuna, NY (US); Lars Liebmann, Mechanicville, NY (US); Nigel Cave, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 24 days.

(21) Appl. No.: 15/433,188

(22) Filed: Feb. 15, 2017

(65) Prior Publication Data
US 2018/0233412 A1    Aug. 16, 2018

(51) Int. Cl.
| H01L 21/8234 | (2006.01) |
| H01L 21/285 | (2006.01) |
| H01L 27/088 | (2006.01) |
| H01L 29/78 | (2006.01) |

(52) U.S. Cl.
CPC ........... *H01L 21/823425* (2013.01); *H01L 21/28518* (2013.01); *H01L 21/823431* (2013.01); *H01L 27/0886* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| 9,397,003 B1 * | 7/2016 | Niimi | H01L 21/823418 |
| 9,666,533 B1 * | 5/2017 | Basker | H01L 23/5329 |
| 2014/0065782 A1 * | 3/2014 | Lu | H01L 29/785 438/294 |
| 2016/0163702 A1 * | 6/2016 | Wu | H01L 27/0922 257/369 |
| 2016/0181268 A1 * | 6/2016 | Chuang | H01L 27/092 257/314 |

* cited by examiner

*Primary Examiner* — Fazli Erdem
*Assistant Examiner* — Scott R Wilson
(74) *Attorney, Agent, or Firm* — Ditthavong & Steiner, P.C.

(57) ABSTRACT

A method of forming a logic or memory cell with less than or equal to 0 nm of TS extending past the active fins and the resulting device are provided. Embodiments include forming gates across pairs of fins on a substrate; forming pairs of RSD between the gates on the fins; forming a planar SAC cap on each of the gates; forming a metal layer over the substrate coplanar with the SACs; forming a TS structure in the metal layer over the fins, the TS structure formed over the pairs of RSD, each upper portion having a width equal to or less than an overall width of a pair of fins; forming spacers on opposite sides of the upper portions; removing the metal layer between adjacent spacers; forming an ILD over the substrate; and forming a CA on each upper portion and a CB on a gate through the ILD.

15 Claims, 16 Drawing Sheets

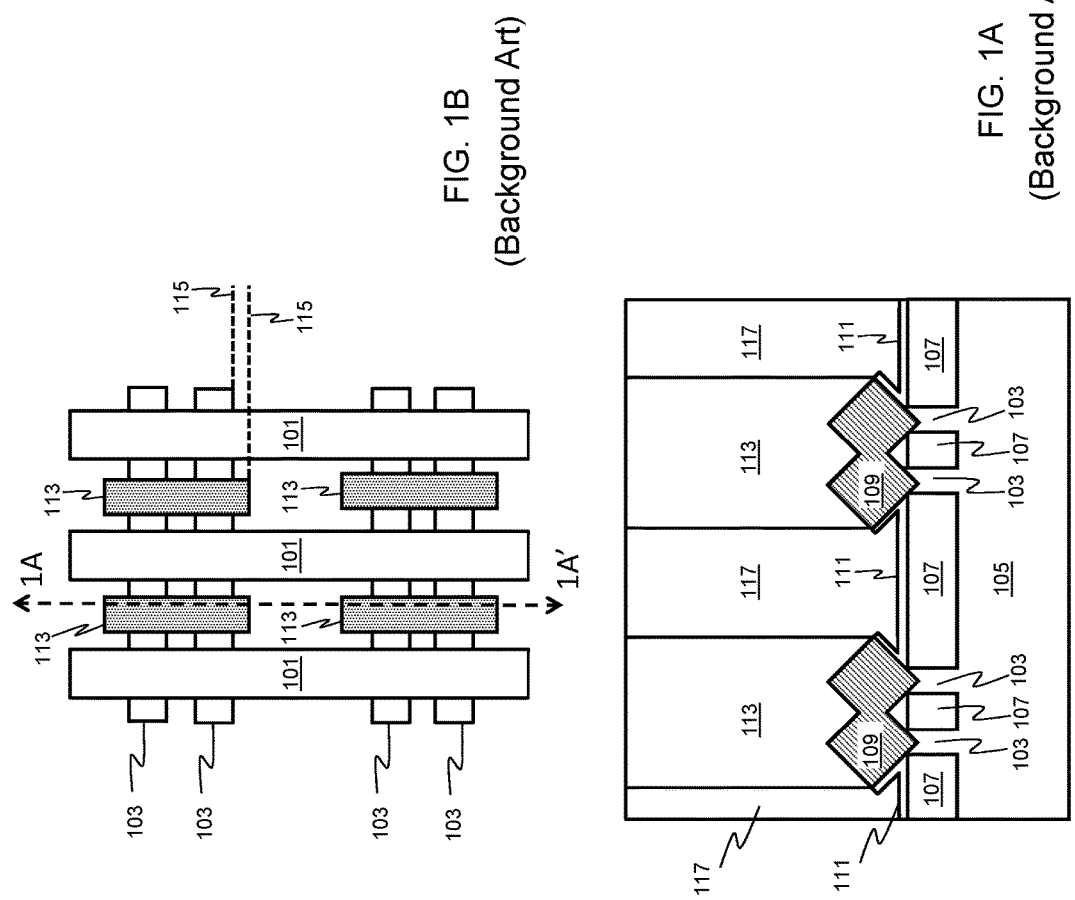

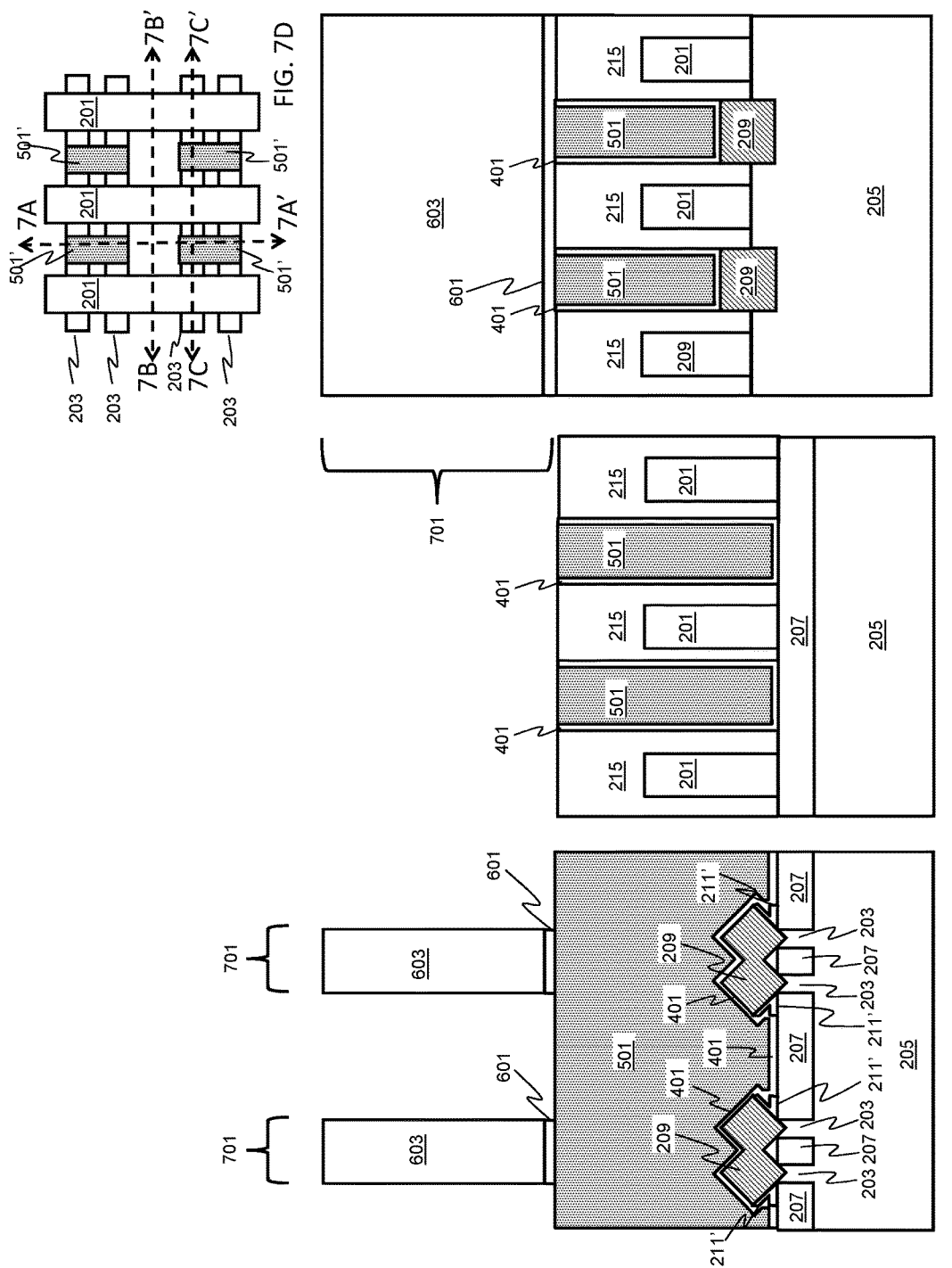

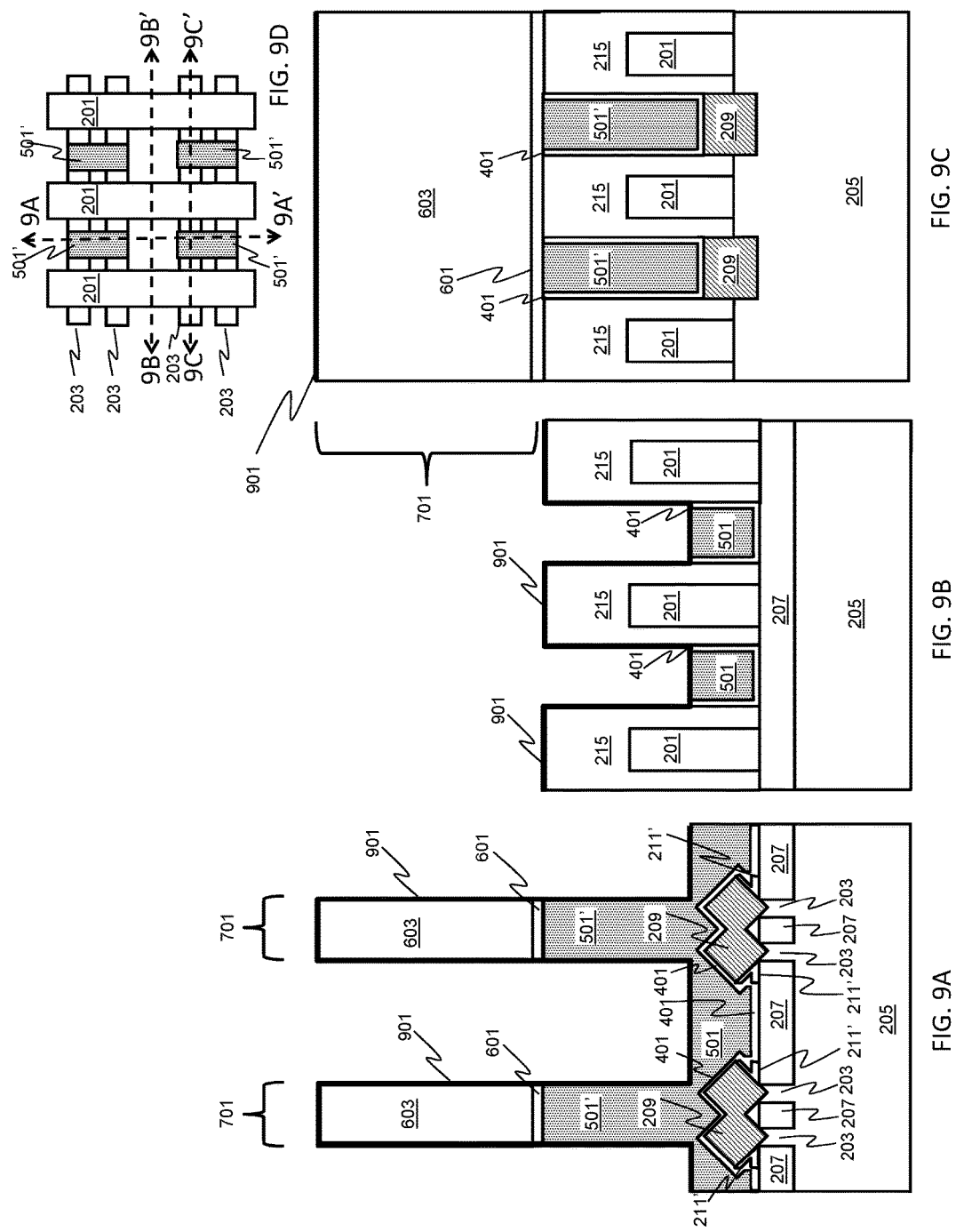

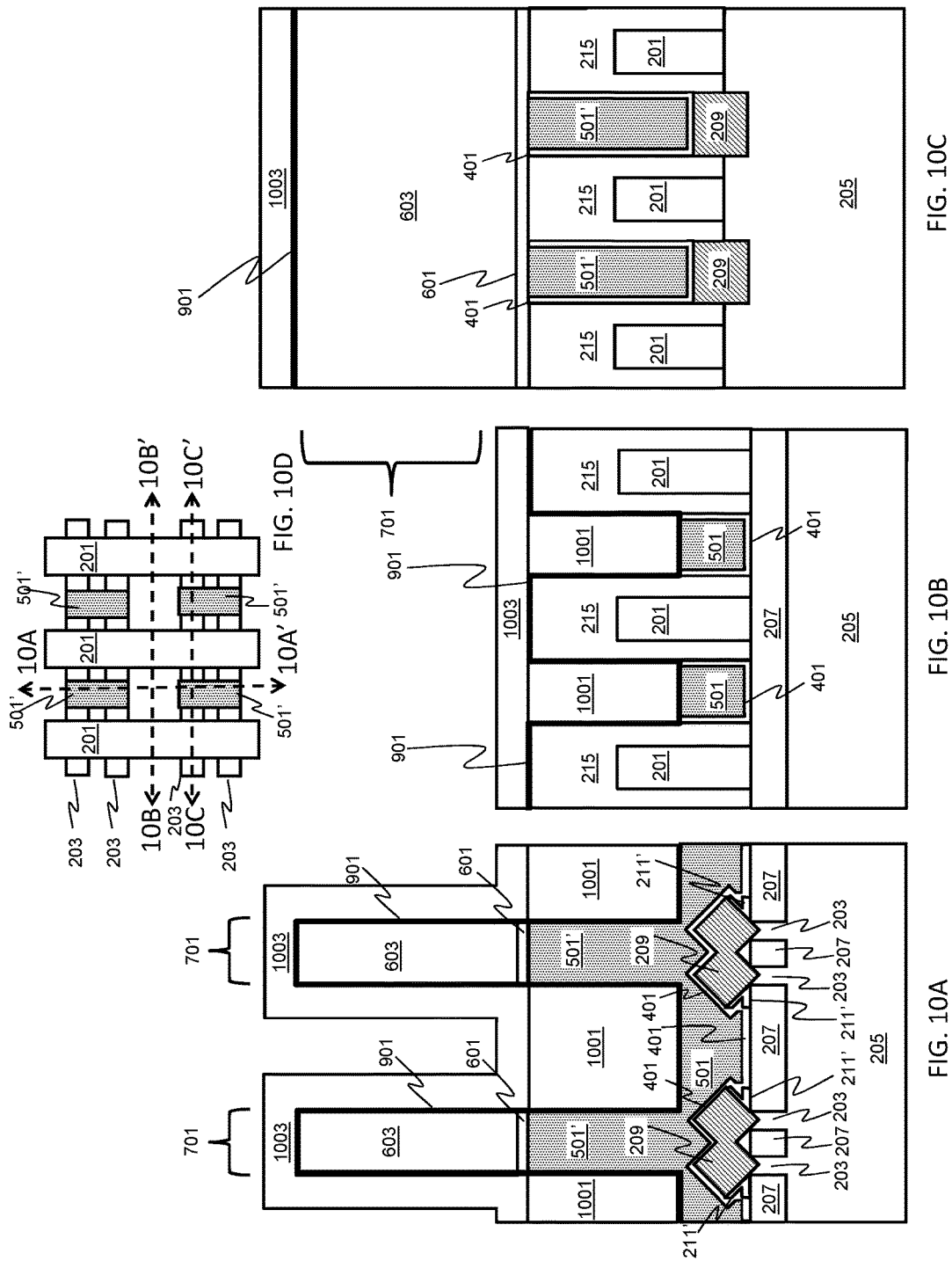

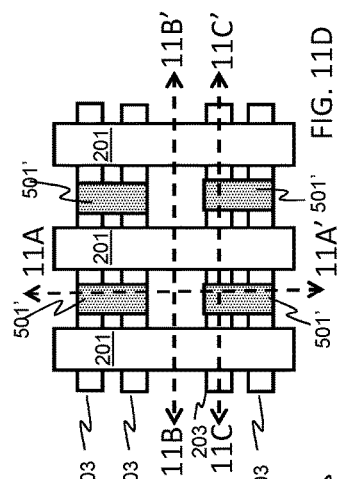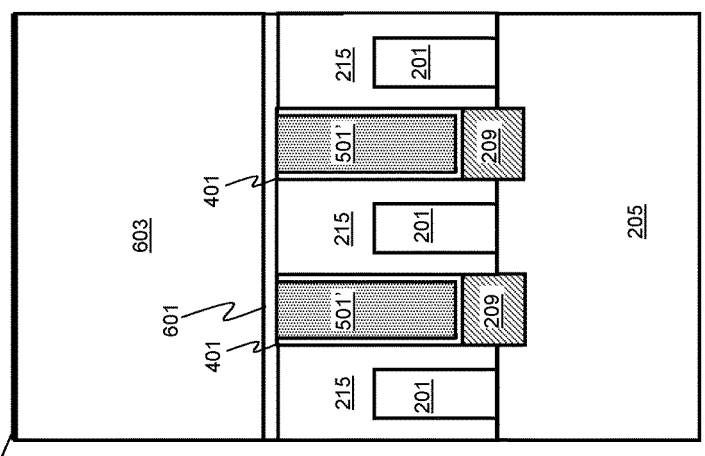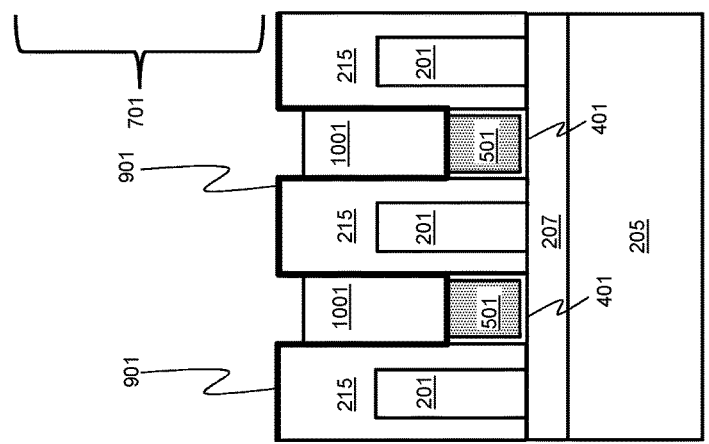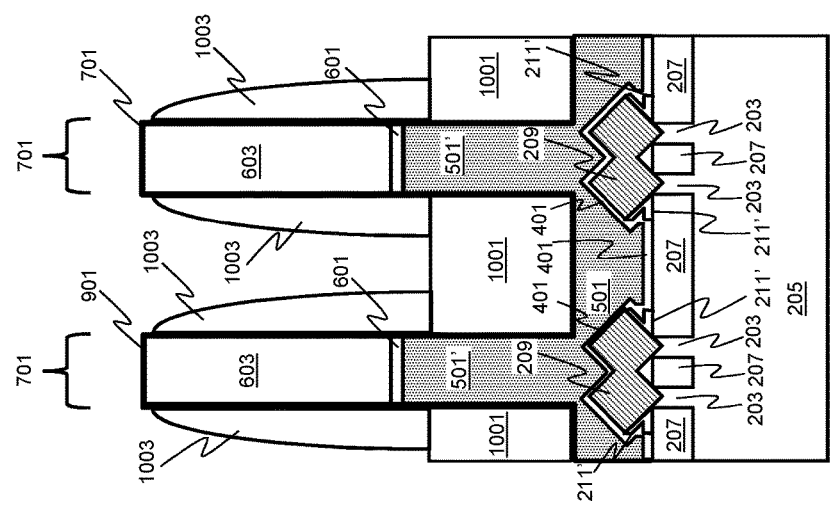

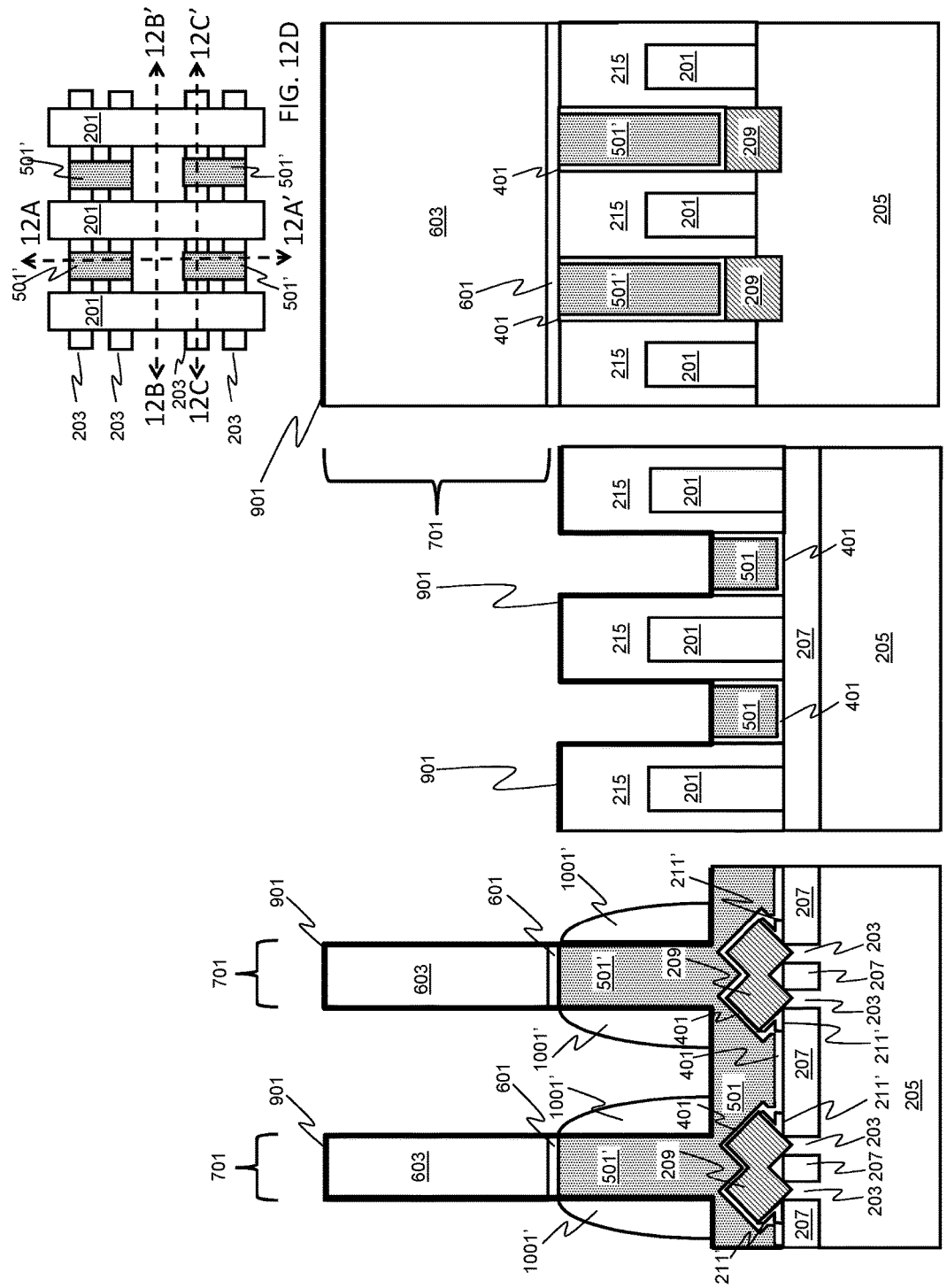

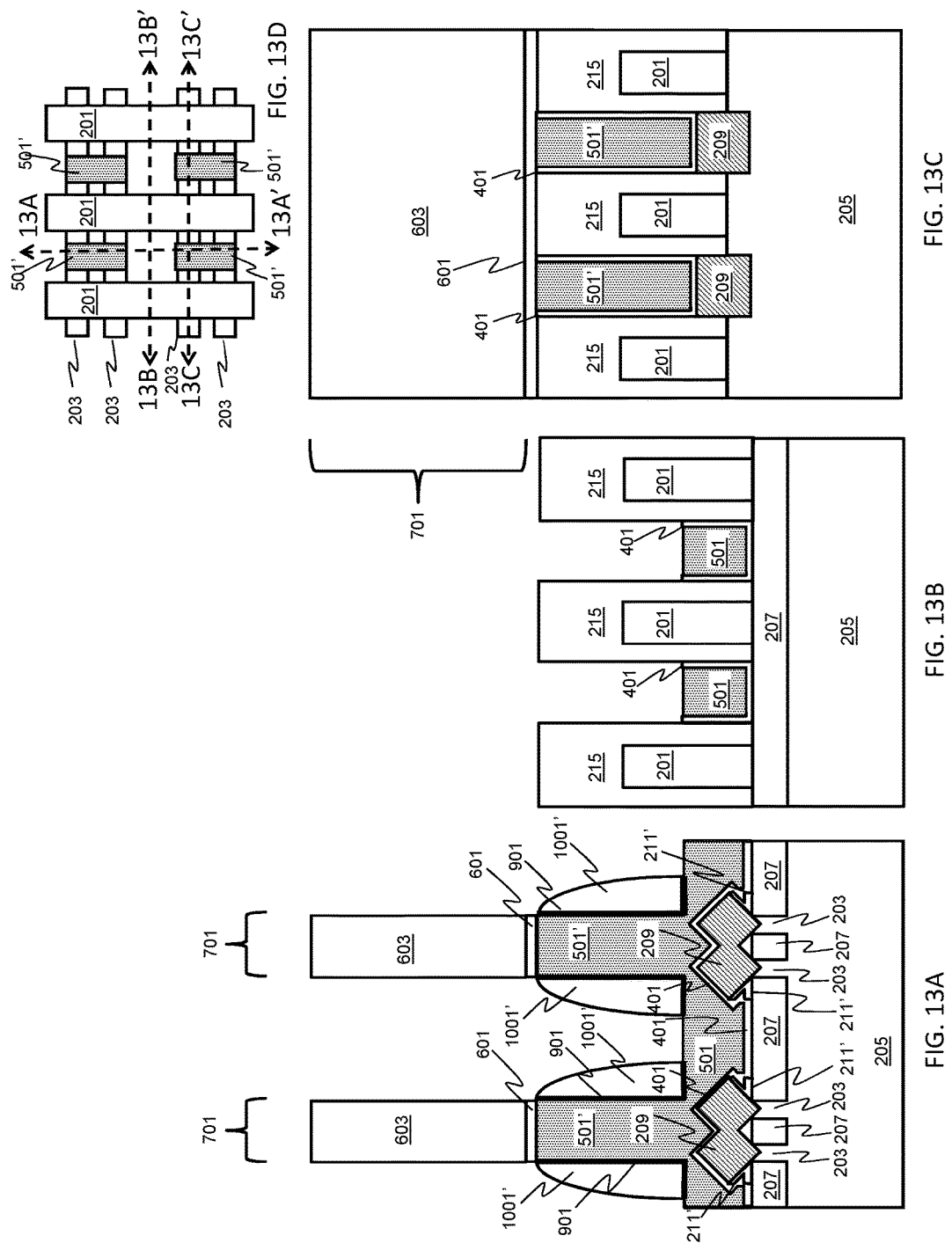

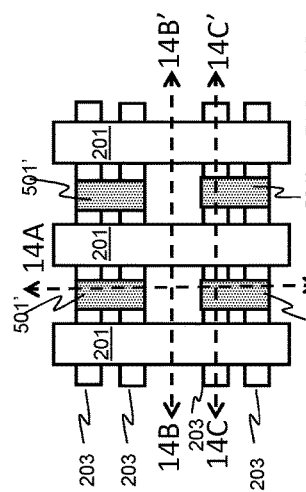
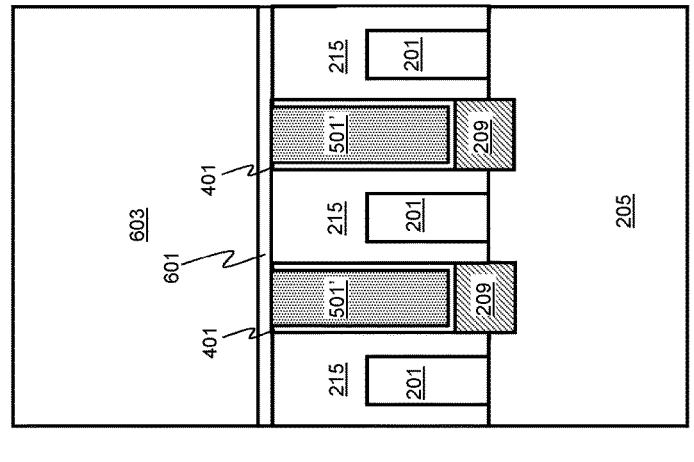
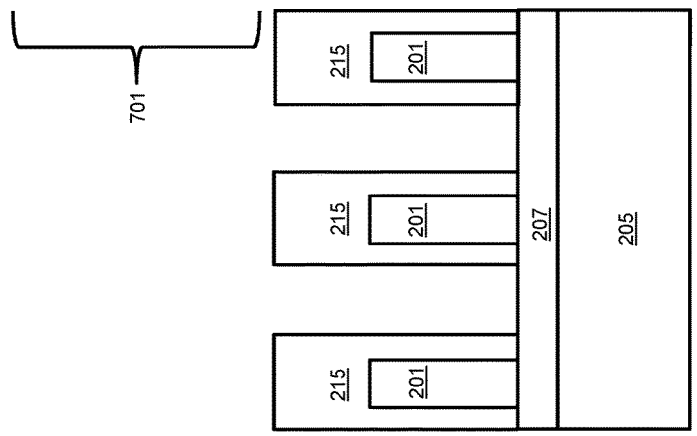
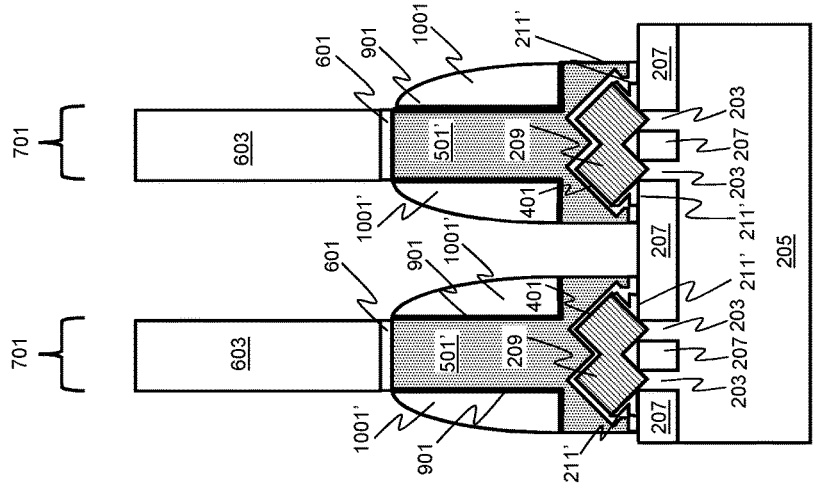
FIG. 14D
FIG. 14C
FIG. 14B
FIG. 14A

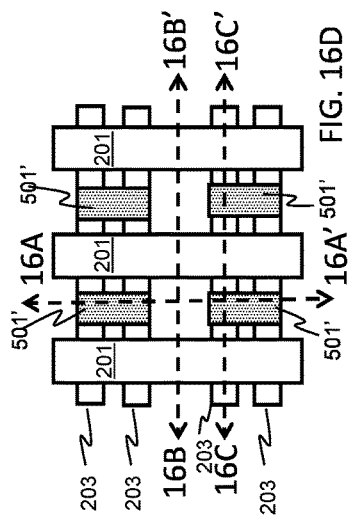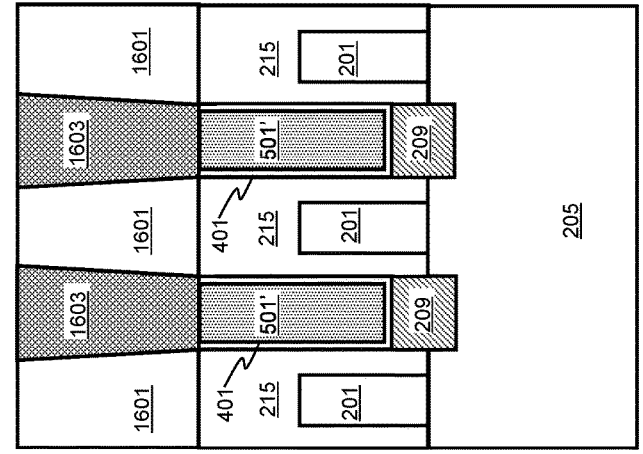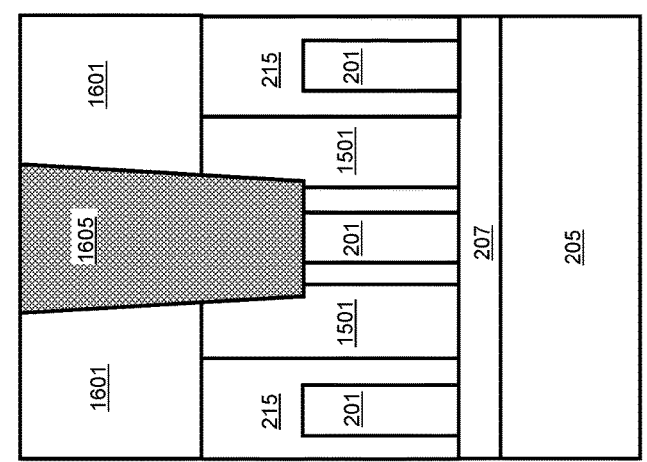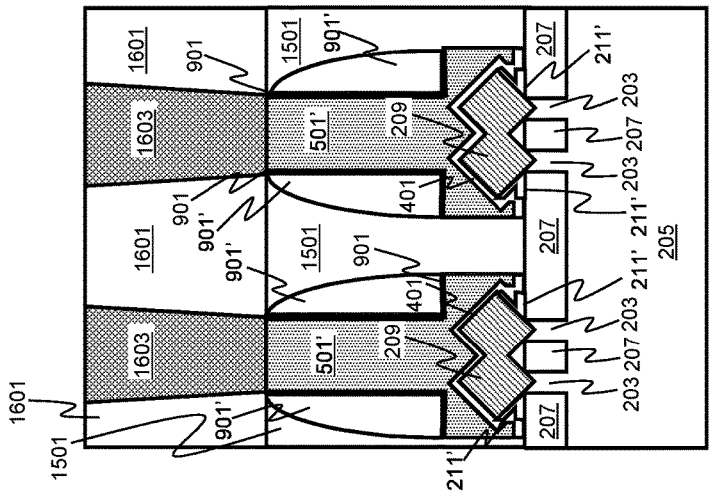

FORMING TS CUT FOR ZERO OR NEGATIVE TS EXTENSION AND RESULTING DEVICE

TECHNICAL FIELD

The present disclosure relates to fin field-effect transistor (FinFET) contact formation. The present disclosure is particularly applicable to the 14 nanometer (nm) technology node and beyond.

BACKGROUND

Cell-height scaling is critical for designing advanced semiconductor devices beyond the 14 nm technology node, e.g., at the 7 nm technology node. A known approach for achieving the required cell-height scaling involves the trench silicide (TS) of a logic or memory cell extending past the fins, as depicted in FIGS. 1A and 1B. FIG. 1A schematically illustrates a cross-sectional view along the cut line 1A-1A' of FIG. 1B, and FIG. 1A is a top view. Adverting to FIGS. 1A and 1B, the known device includes gates 101 across and perpendicular to fins 103 and a shallow trench isolation (STI) layer 105 on the substrate 107. Pairs of raised source/drain (RSD) 109 are on the fins 103 between the gates 101, and a liner 111 is on the downward facing surfaces of the RSD 109 and on the STI layer 107 between the RSD 109. TS 113 are on the RSD 109 and extend past the outside edges of the fins 103, as depicted by the lines 115. Further, an interlayer dielectric (ILD) 117 is between and adjacent to the TS 113. Consequently, there is robust contact between the TS 113 and the RSD 109, but the cell height is relatively large, resulting in a resistance penalty.

A need therefore exists for methodology enabling cell-height scaling beyond the 14 nm technology node without contact area loss or a resistance penalty and the resulting device.

SUMMARY

An aspect of the present disclosure is a process for forming a logic or memory cell with less than or equal to 0 nm of TS extending past the active fins.

Another aspect of the present disclosure is a logic or memory cell device having less than or equal to 0 nm of TS extending past the active fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming two gates across and perpendicular to first and second pairs of fins on a substrate; forming first and second pairs of RSD between the two gates on the first and second pairs of fins, respectively; forming a planar self-aligned contact (SAC) cap on each of the two gates; forming a metal layer over the substrate coplanar with an upper surface of the SACs; forming a TS structure in the metal layer over and perpendicular to the fins, the TS structure having first and second upper portions over the first and second pairs of RSD, respectively, each upper portion having a width equal to or less than an overall width of a pair of fins; forming first and second spacers on opposite sides of the first and second upper portions, respectively; removing the metal layer between adjacent first and second spacers; forming an ILD over the substrate; and forming a source/drain contact (CA) on each upper portion and a gate contact (CB) on one of the two gates through the ILD.

Aspects of the present disclosure include forming each of the two gates as a high-k metal gate (HKMG). Other aspects include forming the first and second pairs of RSD by epitaxial growth. Further aspects include forming a liner over and between the first and second pairs of RSD; forming an ILD over the first and second pairs of RSD and between the two gates prior to forming the SAC cap; and removing the ILD between the two gates by highly selective isotropic etching after forming the SAC caps. Another aspect includes removing the liner from upward facing portions of the first and second pairs of RSD and between the first and second pairs. Additional aspects include forming the metal layer by: forming a blanket silicide layer over the substrate; forming the metal layer over the silicide layer; and planarizing the metal layer down to the upper surface of the SAC caps. Other aspects include forming an oxide layer over the substrate subsequent to forming the metal layer; forming a nitride layer over the oxide layer; patterning the oxide and nitride layers, forming first and second oxide and nitride stacks above the first and second pairs of RSD, respectively, the first and second oxide and nitride stacks formed perpendicular to the two gates and each having with a width equal to or less than an overall width of a pair of fins; and etching the metal layer proximate to the oxide and nitride stacks to a thickness of 5 nm to 15 nm, forming the TS structure upper portions above the first and second pairs of RSD. Further aspects include forming an etch stop liner over the oxide and nitride stacks and the metal layer; and removing the etch stop liner from the metal layer and the oxide and nitride stacks subsequent to forming the spacers on opposite sides of each TS structure upper portion. Another aspect includes forming the spacers on opposite sides of each TS structure upper portion by: filling spaces between the upper portions with oxide; forming a conformal oxide layer over and between the oxide and nitride stacks; and etching the oxide layer by reactive ion etching (RIE), the etch selective to nitride. Additional aspects include etching the oxide layer until the spacers have a width of 6 nm to 10 nm. Other aspects include forming the ILD by: forming a first oxide layer over the substrate; planarizing the first oxide layer down to the upper surface of the SACs; and forming a second oxide layer over the first oxide layer.

Another aspect of the present disclosure is a device including: first and second pairs of fins on a substrate; a STI layer on the substrate between the fins; two HKMGs across and perpendicular to the first and second pairs of fins; a SAC cap on each HKMG; first and second pairs of RSD between the two HKMGs on the first and second pairs of fins, respectively; a liner on downward facing surfaces of each RSD; first and second TS structures over and perpendicular to the first and second pairs of fins, respectively, between the two HKMGs, each TS structure having an upper portion over a pair of RSD, with a width equal to or less than an overall width of a pair of fins; an ILD over the substrate; a CA through the ILD down to each TS structure; and a CB through the ILD down to one of the two HKMGs.

Aspects of the device include the first and second pairs of RSD being formed by epitaxial growth. Other aspects include a lower portion of each TS structure having a width greater than a width of each pair of RSD and a thickness of 5 nm to 15 nm. Further aspects include an etch stop liner on sidewalls of each upper portion of the TS structures and on an upper surface of the lower portion of each TS structure. Another aspect includes the upper portion of each TS structure having no metal or barrier liner and the lower portion, each pair of RSD, and the STI layer having a metal or barrier liner.

A further aspect of the present disclosure is a method including: forming two HKMGs, each with first spacers at opposite sides thereof, across and perpendicular to first and second pairs of fins formed through a STI layer on a substrate; epitaxially growing first and second pairs of RSD between the first and second gates on first and second pairs of fins, respectively; forming a planar SAC cap on each metal gate and respective spacers; forming a liner on downward facing surfaces of each RSD; forming a blanket silicide layer over the substrate; forming a metal layer over the silicide layer; planarizing the metal layer down to an upper surface of the SACs; forming a TS structure in the metal layer over and perpendicular to the fins, the TS structure having first and second upper portions over the first and second pairs of RSD, respectively, each upper portion having a width equal to or less than an overall width of a pair of fins; forming second spacers on opposite sides of each upper portion of each TS structure; removing the metal layer proximate to each second spacer; forming a first oxide layer over the substrate; planarizing the first oxide layer down to the upper surface of the SACs; forming a second oxide layer over the first oxide layer; and forming a CA on each upper portion and a CB on one or the two HKMGs through the second oxide layer.

Aspects of the present disclosure include forming an oxide layer over the substrate subsequent to forming the metal layer; forming a nitride layer over the oxide layer; patterning the oxide and nitride layers, forming first and second oxide and nitride stacks above the first and second pairs of RSD, respectively, the first and second oxide and nitride stacks being perpendicular to the two HKMGs and each having with a width equal to or less than an overall width of a pair of fins; etching the metal layer proximate to the oxide and nitride stacks to a thickness of 5 nm to 15 nm, forming the TS structure upper portions above the first and second pairs of RSD. Other aspects include forming an etch stop liner over the oxide and nitride stacks and the metal layer; and removing the etch stop liner from the metal layer and the oxide and nitride stacks subsequent to the second spacer formation. Further aspects include forming the second spacers on opposite sides of each TS structure upper portion by: filing spacers between the upper portions with oxide; forming a conformal oxide layer over and between the oxide and nitride stacks; and etching the oxide layer by RIE, the etch selective to nitride until each of the second spacers have a width of 6 nm to 10 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1A schematically illustrates a cross-sectional view of a background logic or memory cell;

FIG. 1B schematically illustrates a top view showing the cut line for FIG. 1A;

FIGS. 2A, 2B, and 2C through 16A, 16B, 16C, respectively, schematically illustrate cross-sectional views of a process flow for forming a logic or memory cell device having less than or equal to 0 nm of TS extending past the active fins, in accordance with an exemplary embodiment; and FIGS. 2D through 16D schematically illustrate a top view showing the cut lines for FIGS. 2A, 2B, and 2C through 16A, 16B, and 16C, respectively.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of relatively large cell height, reduced TS contact area, and a resistance penalty attendant upon forming logic and memory cell devices beyond the 14 nm technology node. The problems are solved, inter alia, by using a two stage TS cut.

Methodology in accordance with embodiments of the present disclosure includes forming two gates across and perpendicular to first and second pairs of fins on a substrate. First and second pairs of RSD are formed between the two gates on the first and second pairs of fins, respectively. A planar SAC cap is formed on each of the two gates and a metal layer is formed over the substrate coplanar with an upper surface of the SACs. A TS structure is formed in the metal layer over and perpendicular to the fins, the TS structure having first and second upper portions over the first and second pairs of RSD, respectively, each upper portion having a width equal to or less than an overall width of a pair of fins. First and second spacers are formed on opposite sides of the first and second upper portions, respectively, and the metal layer is removed between adjacent first and second spacers. An ILD is formed over the substrate and a CA and a CB are formed on each upper portion and on one of the two gates, respectively, through the ILD.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
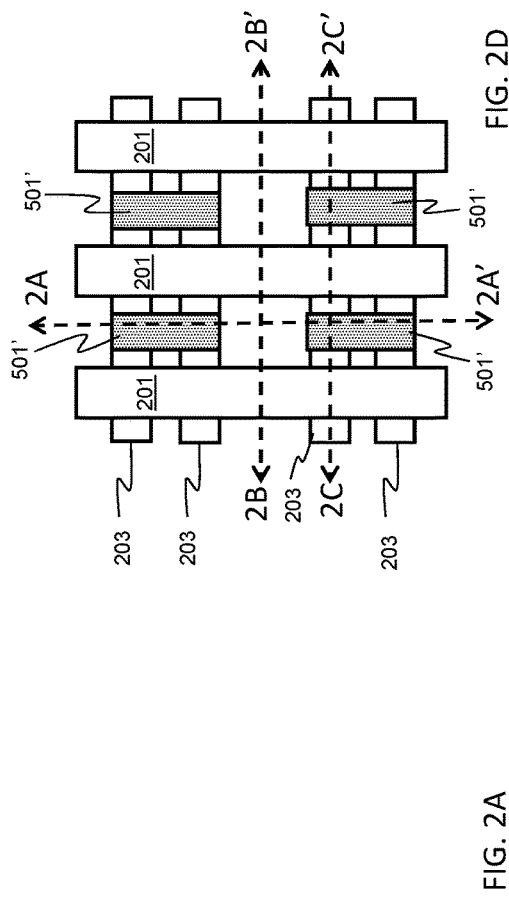
Figure 2B:
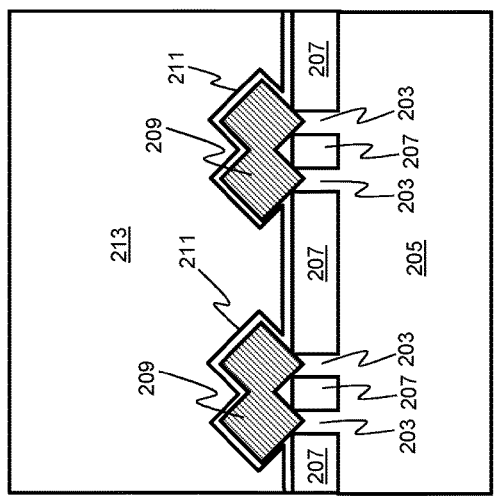
Figure 2D:
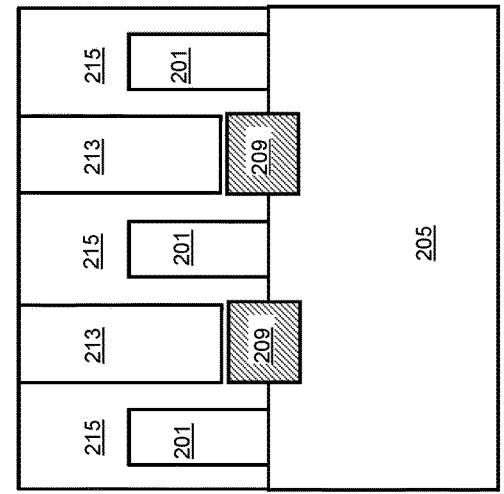
Figure 2C:
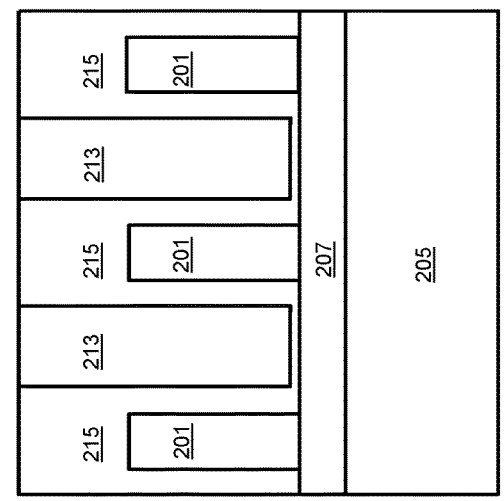
Figure 3D:
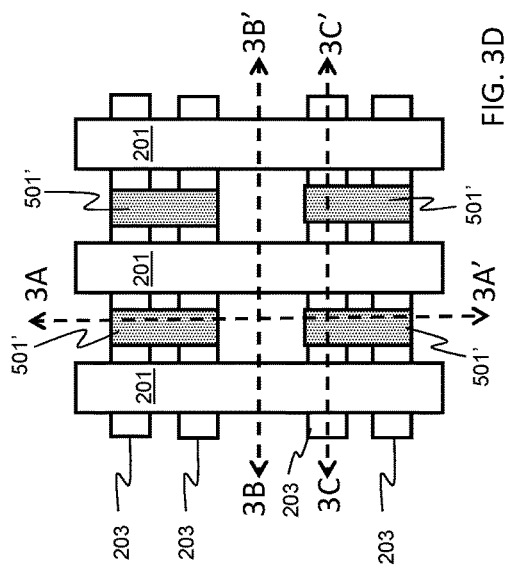
Figure 3C:
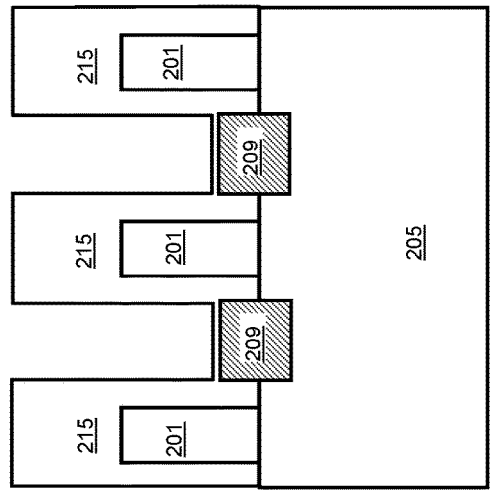
Figure 3A:
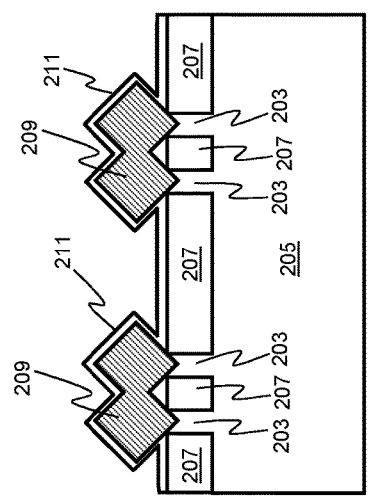
Figure 3B:
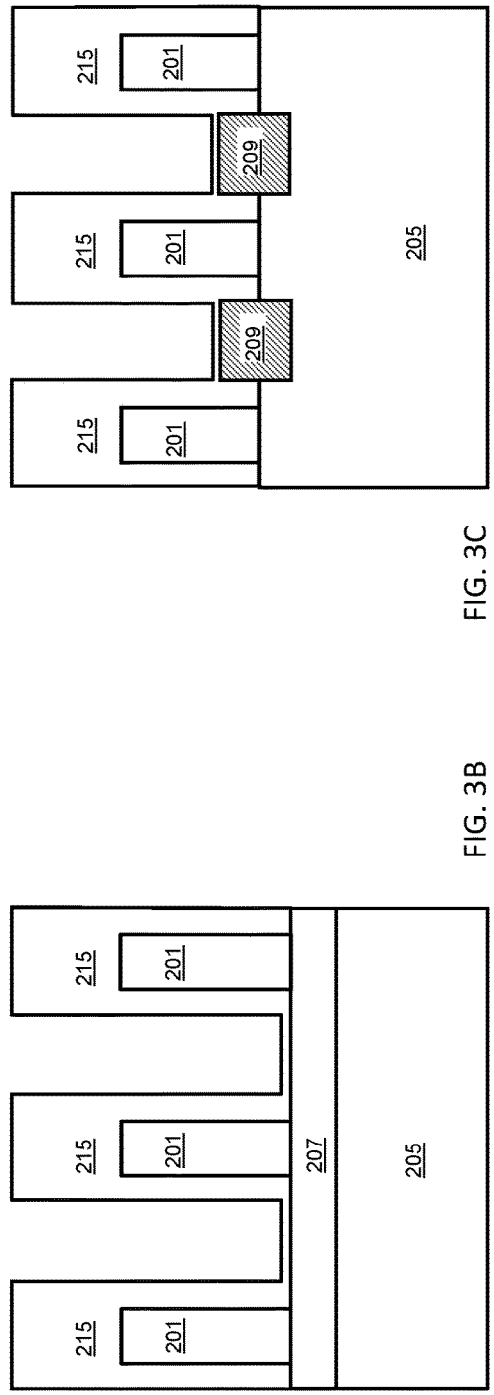
Figure 4A:
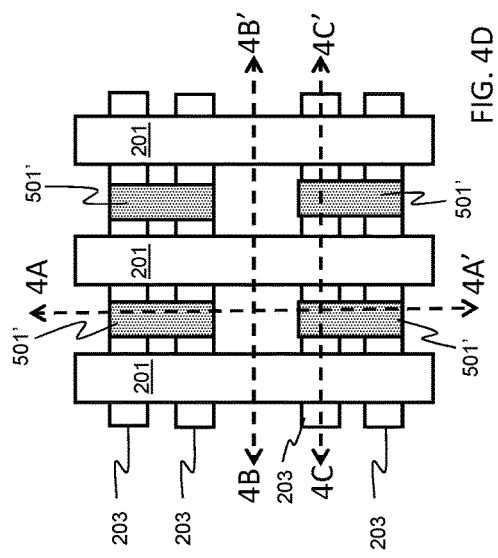
Figure 4B:
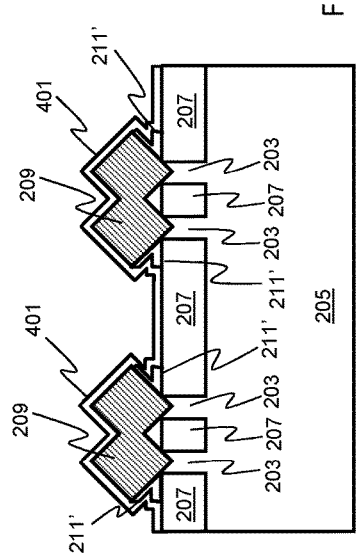
Figure 4D:
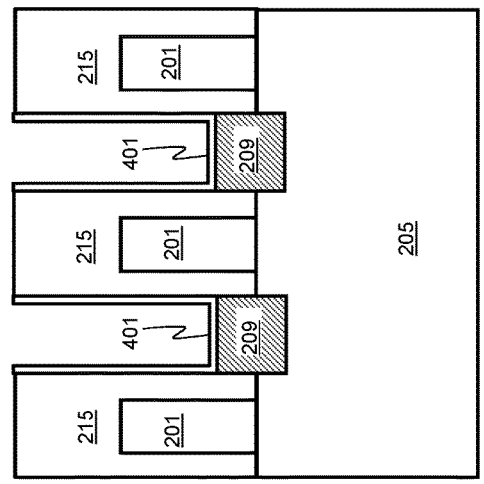
Figure 4C:
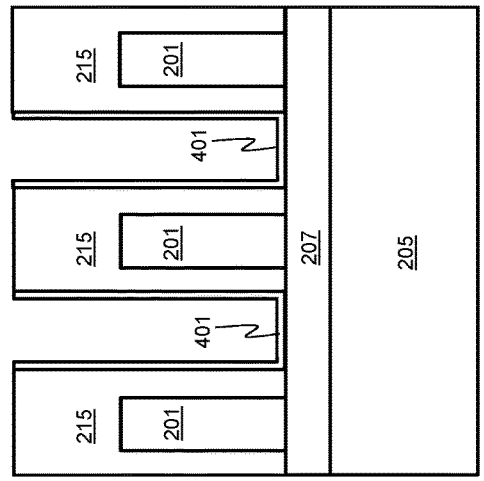
Figure 5D:
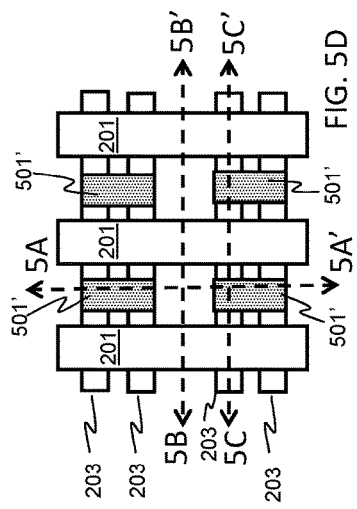
Figure 5C:
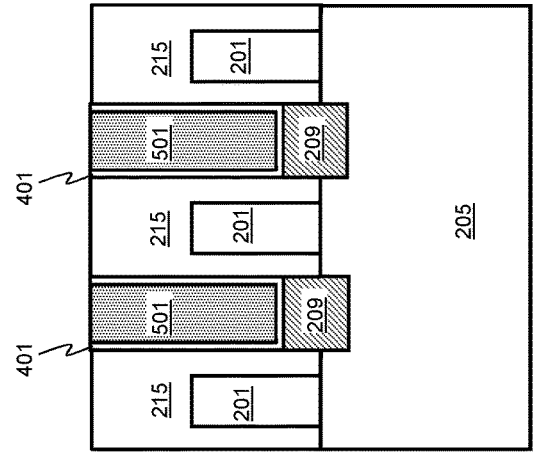
Figure 5B:
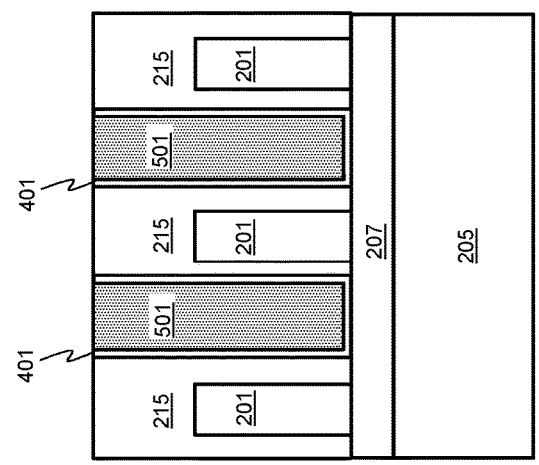
Figure 5A:
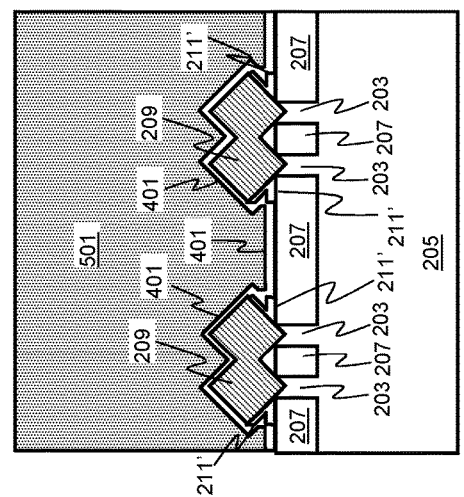
Figure 6D:
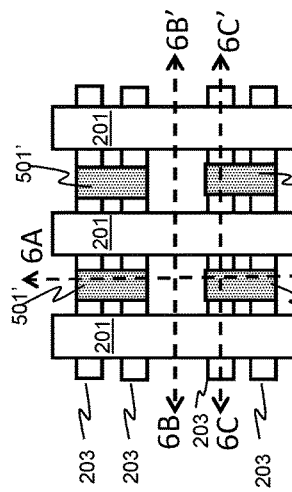
Figure 6C:
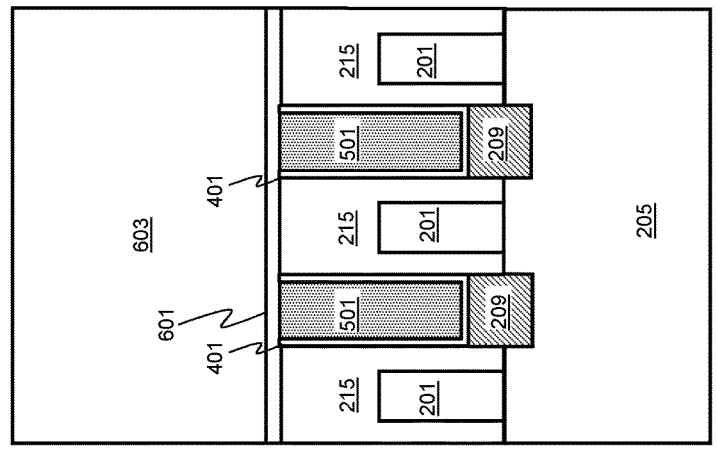
Figure 6B:
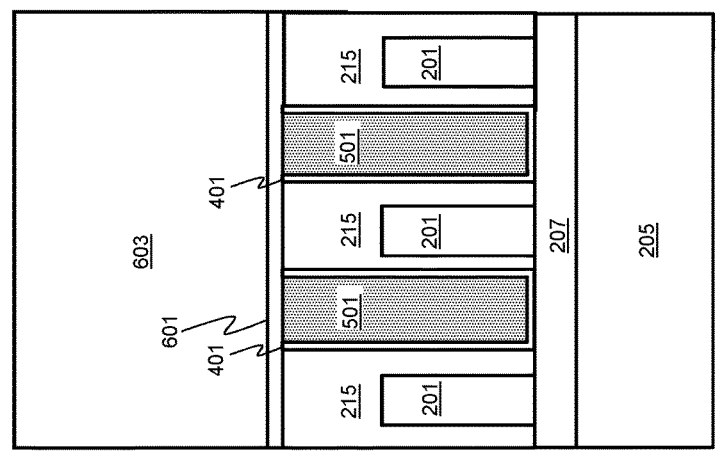
Figure 6A:
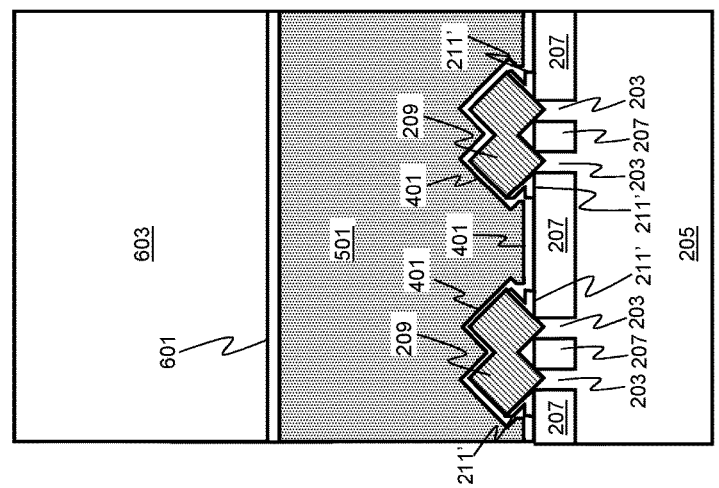
Figure 8A:
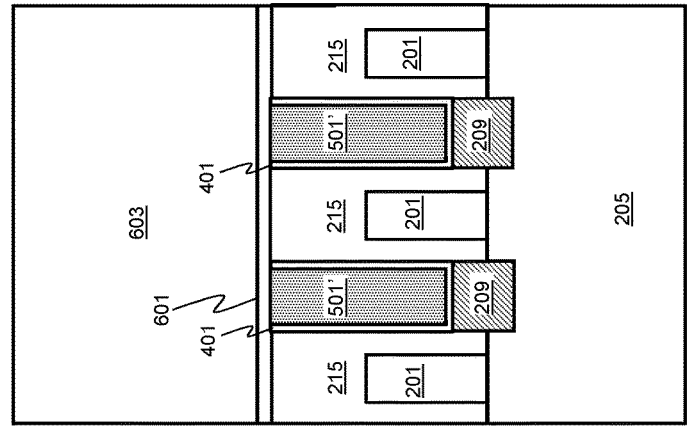
Figure 8B:
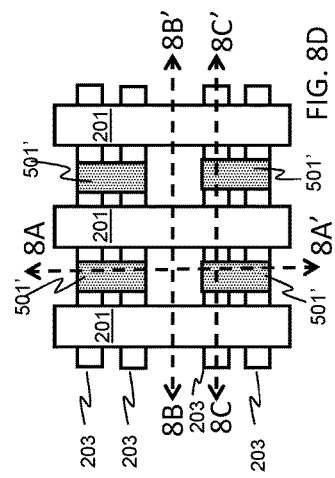
Figure 8C:
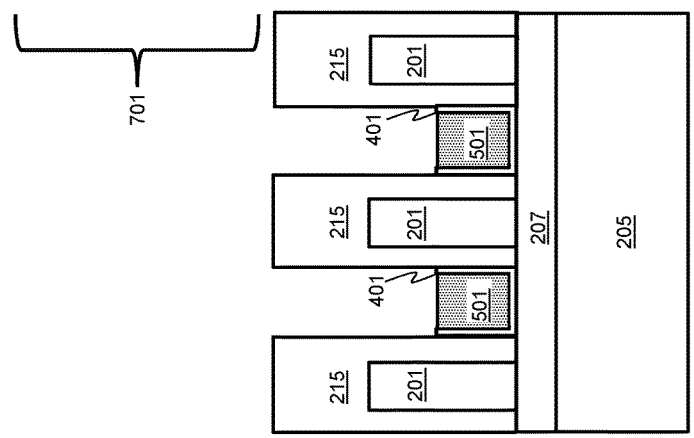
Figure 8D:
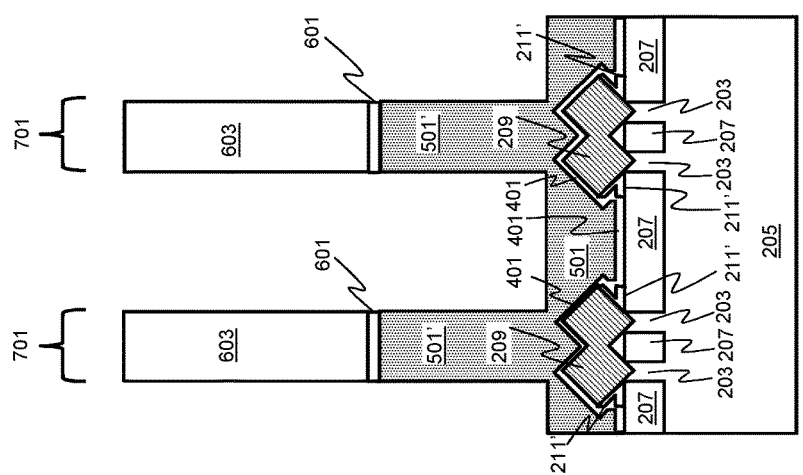
Figure 15D:
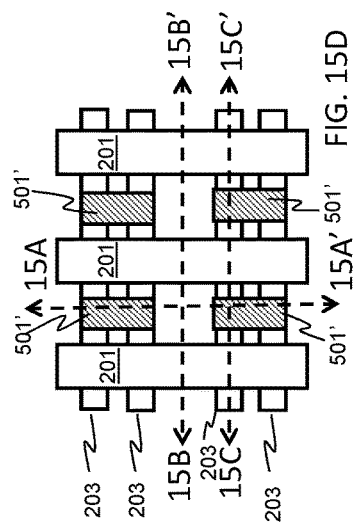
Figure 15C:
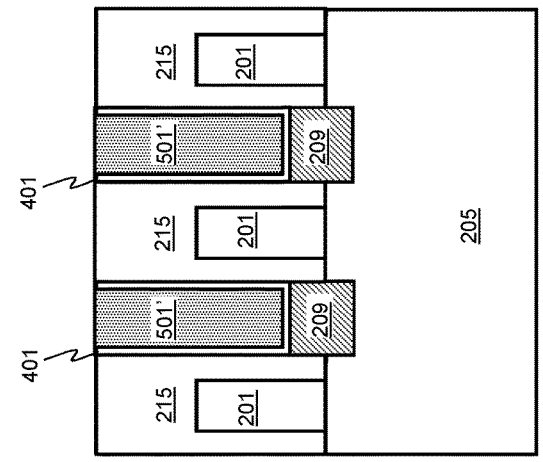
Figure 15B:
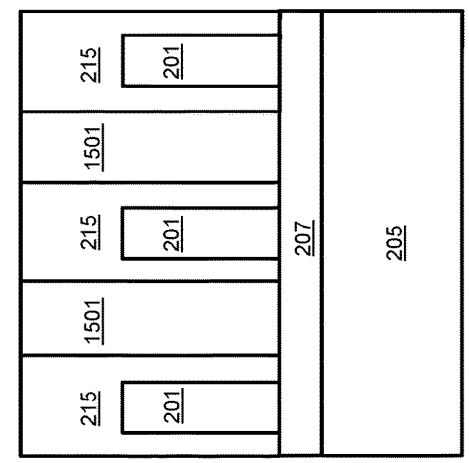
Figure 15A:
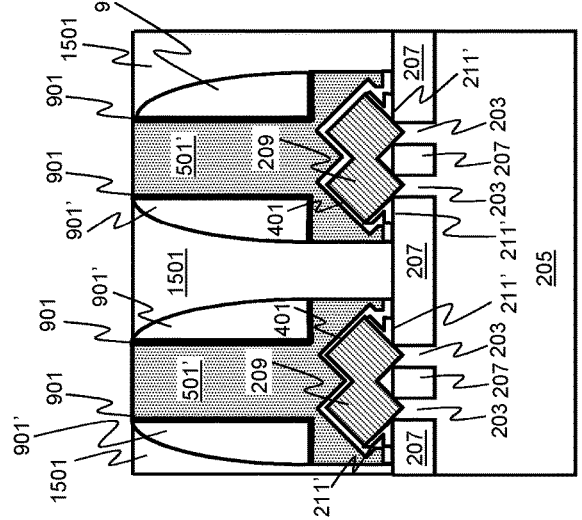

FIGS. 2A, 2B, 2C through 16A, 16B, and 16C, respectively, schematically illustrate cross-sectional views of a process flow for forming a logic or memory device having less than or equal to 0 nm of TS extending past the active fins along the cut lines 2A-2A', 2B-2B', and 2C-2C' through 16A-16A', 16B-16B', and 16C-16C', respectively, of FIGS. 2D through 16D, respectively, and FIGS. 2D through 16D are top views showing the cut lines for FIGS. 2A, 2B, and 2C through 16A, 16B, and 16C, respectively. FIGS. 2D through 16D are rudimentarily depicted for illustrative purposes and are not complete top views. Adverting to FIGS. 2A, 2B, 2C, and 2D, HKMG gates 201 are formed across and perpendicular to fins 203 that are already formed on the substrate 205. The HKMG gates 201 are formed of a high-k dielectric, e.g., hafnium (IV) oxide (HfO$_2$) or zirconium dioxide (ZrO$_2$), a work function metal, such as titanium nitride (TiN), titanium aluminum (TiAl) titanium carbide (TiC), or tantalum nitride (TaN), and an additional metal, e.g., tungsten (W), cobalt (Co), or Ruthenium (Ru). A STI layer 207 is also formed on the substrate 205 between the fins 203. Pairs of RSD 209 are then formed, e.g., by epitaxial growth, on the fins 203 between the gates 201. Next, a liner 211 is formed, e.g., of silicon nitride (SiN), over and between the RSD 209, and an ILD 213 is formed over the RSD 209 and between the gates 201. Thereafter, a SAC cap 215 is formed, e.g., to a thickness of 20 nm to 45 nm, on each gate 201 and planarized, e.g., by chemical mechanical polishing (CMP).

Adverting to FIGS. 3A, 3B, 3C, and 3D, the ILD 213 is removed between the gates 201 by a highly selective isotropic etching, e.g., using buffered hydrofluoric acid (BHF), thereby removing only the ILD 213 and causing minimal damage to the corners of the SAC caps 215. The liner 211 is then removed, e.g., by a quick plasma dry etch, from upward facing portions of the RSD 209 and between the RSD 209, forming the liner 211', as depicted in FIGS. 4A, 4B, 4C, and 4D. A metal or barrier liner 401, e.g., formed of titanium (Ti), TiN, nickel platinum (NiPt), or the like, is formed over the RSD 209, the liner 211', and the STI 207 before the formation of the subsequent blanket silicide.

A blanket silicide (not shown for illustrative convenience) is formed over the substrate 205 and the metal or barrier liner 401 and a metal layer 501 is formed, e.g., of W, Co, or Ru, over the silicide layer. The metal layer 501 is then planarized, e.g., by CMP, down to the upper surface of the SAC caps 215, as depicted in FIGS. 5A, 5B, 5C, and 5D. Adverting to FIGS. 6A, 6B, 6C, and 6D, a thin oxide layer 601 is formed, e.g., with a thickness of 3 nm to 10 nm, over the substrate 205 subsequent to forming the metal layer 501. Thereafter, a nitride layer 603 is formed, e.g., of SiN and with a thickness of 40 nm to 100 nm, over the oxide layer 601.

Adverting to FIGS. 7A, 7B, 7C, and 7D, the nitride layer 603 and the oxide layer 601 are patterned, forming oxide and nitride stacks 701. The oxide and nitride stacks 701 are formed perpendicular to the gates 201 and some of them have a width equal to or less than an overall width of a pair of fins 203. The metal layer 501 and a portion of the metal or barrier liner 401 along the B-B' axis are then etched proximate to the oxide and nitride stacks 701, e.g., 40 nm to 70 nm in depth, or until 5 nm to 15 nm of the metal layer 501, for example, remains above the RSD 209, thereby forming the upper portions of the subsequently formed TS structure 501', as depicted in FIGS. 8A, 8B, 8C, and 8D. Consequently, the upper portions of the TS structure 501' have less than or equal to 0 nm of extension past the fins 203, i.e., 0 or negative TS extension to fin. This is the first TS cut.

An optional etch stop liner 901 may be formed, e.g., of TiN or HfO$_2$ with a thickness of 1.5 nm to 3 nm, over the oxide and nitride stacks 701 and the metal layer 501, as depicted in FIGS. 9A, 9B, 9C, and 9D. If the subsequent oxide etch process is sufficiently selective to the nitride layer 603, then the etch stop layer 901 is not required. Adverting to FIGS. 10A, 10B, 10C, and 10D, spaces between the upper portions of the TS structure 501' are filled with an oxide layer 1001. A conformal oxide layer 1003 is then formed, e.g., with a thickness of at least half of the width of spacing along the B-B' axis or 6 nm to 10 nm, over and between the oxide and nitride stacks 701.

Adverting to FIGS. 11A, 11B, 11C, and 11D, the oxide layers 1001 and 1003 are partially etched, e.g., by RIE, selective to TiN or HfO$_2$ or SiN when the etch stop liner 901 is not included. The oxide layers 1001 and 1003 are then further etched, e.g., by RIE, until the oxide layer 1001 has a remaining width of 6 nm to 10 nm, for example, forming spacers 1001', as depicted in FIGS. 12A, 12B, 12C, and 12D. The exposed protective etch stop liner 901 (if present) is then removed, as depicted in FIGS. 13A, 13B, 13C, and 13D.

Next, the second TS cut is performed by removing the exposed portions of the metal layer 501 and the metal or barrier liner 401 along the B-B' axis, e.g., by etching, down to the STI layer 207 between and adjacent to the spacers 1001', forming the complete TS structure 501' over each pair of RSD 209, as depicted in FIGS. 14A, 14B, 14C, and 14D. Consequently, the metal or barrier liner 401 is removed from the TS structure 501's sidewalls along the B-B's axis. An oxide ILD 1501 is then formed over the substrate 205 and planarized, e.g., by CMP, down to the upper surface of the SAC caps 215, as depicted in FIGS. 15A, 15B, 15C, and 15D. Adverting to FIGS. 16A, 16B, 16C, and 16D, an oxide ILD 1601 is then formed over the ILD 1501. Thereafter, a CA 1603 is formed on each upper portion of the TS structure 501', and a CB 1605 is formed on one of the gates 201, each CA 1603 and CB 1605 being formed through the ILD 1601.

The embodiments of the present disclosure can achieve several technical effects including less SAC cap loss resulting in better yields relative to known processes and no contact area degradation or a resistance penalty while achieving the required logic and memory cell-height scaling for the 14 nm technology node and beyond. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including logic or memory cells, particularly in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming two gates across and perpendicular to first and second pairs of fins on a substrate;

forming first and second pairs of raised source/drain (RSD) between the two gates on the first and second pairs of fins, respectively;

forming a planar self-aligned contact (SAC) cap on each of the two gates;

forming a metal layer over the substrate coplanar with an upper surface of the SACs;

forming an oxide layer over the substrate subsequent to forming the metal layer;

forming a nitride layer over the oxide layer;

patterning the oxide and nitride layers, forming first and second oxide and nitride stacks above the first and second pairs of RSD, respectively, the first and second oxide and nitride stacks formed perpendicular to the two gates and each having with a width equal to or less than an overall width of a pair of fins;

etching the metal layer proximate to the oxide and nitride stacks forming trench silicide (TS) structure upper portions above the first and second pairs of RSD, and forming the TS structure in the metal layer over and perpendicular to the fins, the TS structure having first and second upper portions over the first and second pairs of RSD, respectively, each upper portion having a width equal to or less than an overall width of a pair of fins;

forming first and second spacers on opposite sides of the first and second upper portions, respectively;

removing the metal layer between adjacent first and second spacers;

forming an interlayer dielectric (ILD) over the substrate; and forming a source/drain contact (CA) on each upper portion and a gate contact (CB) on one of the two gates through the ILD.

2. The method according to claim 1, comprising forming each of the two gates as a high-k metal gate (HKMG).

3. The method according to claim 1, comprising forming the first and second pairs of RSD by epitaxial growth.

4. The method according to claim 1, further comprising:
forming a liner over and between the first and second pairs of RSD;
forming an ILD over the first and second pairs of RSD and between the two gates prior to forming the SAC cap; and
removing the ILD between the two gates by highly selective isotropic etching after forming the SAC caps.

5. The method according to claim 4, comprising removing the liner from upward facing portions of the first and second pairs of RSD and between the first and second pairs.

6. The method according to claim 1, comprising forming the metal layer by:
forming a blanket silicide layer over the substrate;
forming the metal layer over the silicide layer; and
planarizing the metal layer down to the upper surface of the SAC caps.

7. The method according to claim 1, comprising:
etching the metal layer proximate to the oxide and nitride stacks to a thickness of 5 nanometer (nm) to 15 nm.

8. The method according to claim 7, further comprising:
forming an etch stop liner over the oxide and nitride stacks and the metal layer; and
removing the etch stop liner from the metal layer and the oxide and nitride stacks subsequent to forming the spacers on opposite sides of each TS structure upper portion.

9. The method according to claim 8, comprising forming the spacers on opposite sides of each TS structure upper portion by:
filling spaces between the upper portions with oxide;
forming a conformal oxide layer over and between the oxide and nitride stacks; and
etching the oxide layer by reactive ion etching (RIE), the etch selective to nitride.

10. The method according to claim 9, comprising etching the oxide layer until the spacers have a width of 6 nm to 10 nm.

11. The method according to claim 1, comprising forming the ILD by:
forming a first oxide layer over the substrate;
planarizing the first oxide layer down to the upper surface of the SACs; and
forming a second oxide layer over the first oxide layer.

12. A method comprising:
forming two high-k metal gates (HKMGs) across and perpendicular to first and second pairs of fins formed through a shallow trench isolation (STI) layer on a substrate;
epitaxially growing first and second pairs of raised source/drain (RSD) between the first and second gates on first and second pairs of fins, respectively;
forming a planar self-aligned contact (SAC) cap on each metal gate;
forming a liner on downward facing surfaces of each RSD;
forming a blanket silicide layer over the substrate;
forming a metal layer over the silicide layer;
planarizing the metal layer down to an upper surface of the SACs;
forming an oxide layer over the substrate subsequent to forming the metal layer;
forming a nitride layer over the oxide layer;
patterning the oxide and nitride layers, forming first and second oxide and nitride stacks above the first and second pairs of RSD, respectively, the first and second oxide and nitride stacks being perpendicular to the two HKMGs and each having with a width equal to or less than an overall width of a pair of fins;
etching the metal layer proximate to the oxide and nitride stacks forming trench silicide (TS) structure upper portions above the first and second pairs of RSD, and forming the TS structure in the metal layer over and perpendicular to the fins, the TS structure having first and second upper portions over the first and second pairs of RSD, respectively, each upper portion having a width equal to or less than an overall width of a pair of fins;
forming second spacers on opposite sides of each upper portion of each TS structure;
removing the metal layer proximate to each second spacer;
forming a first oxide layer over the substrate;
planarizing the first oxide layer down to the upper surface of the SACs;
forming a second oxide layer over the first oxide layer; and
forming a source/drain contact (CA) on each upper portion and a gate contact (CB) on one of the two HKMGs through the second oxide layer.

13. The method according to claim 12, comprising:
etching the metal layer proximate to the oxide and nitride stacks to a thickness of 5 nanometer (nm) to 15 nm.

14. The method according to claim 13, further comprising:
- forming an etch stop liner over the oxide and nitride stacks and the metal layer; and
- removing the etch stop liner from the metal layer and the oxide and nitride stacks subsequent to the second spacer formation.

15. The method according to claim 14, comprising forming the second spacers on opposite sides of each TS structure upper portion by:
- filing spacers between the upper portions with oxide;
- forming a conformal oxide layer over and between the oxide and nitride stacks; and
- etching the oxide layer by reactive ion etching (RIE), the etch selective to nitride until each of the second spacers have a width of 6 nm to 10 nm.

* * * * *